United States Patent
Yang et al.

(10) Patent No.: US 6,534,356 B1
(45) Date of Patent: Mar. 18, 2003

(54) METHOD OF REDUCING DARK CURRENT FOR AN IMAGE SENSOR DEVICE VIA USE OF A POLYSILICON PAD

(75) Inventors: Hua Yu Yang, Kaohsiung (TW); An Min Chiang, Hsin-Chu (TW); Wei-Kun Yeh, Hsin-Chu (TW); Chi-Hsiang Lee, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/119,367

(22) Filed: Apr. 9, 2002

(51) Int. Cl.[7] .......................................... H01L 21/8249
(52) U.S. Cl. ........................ 438/234; 438/238; 438/75
(58) Field of Search .......................... 438/234, 75, 74, 438/76, 78, 79, 144, 586, 66

(56) References Cited

U.S. PATENT DOCUMENTS

| | | | |
|---|---|---|---|
| 5,576,237 A | 11/1996 | Bergemont et al. | 437/50 |
| 5,589,418 A * | 12/1996 | Kalnitsky | 438/586 |
| 5,591,997 A | 1/1997 | Guidash et al. | 257/290 |
| 5,654,565 A | 8/1997 | Hokari | 257/222 |
| 5,854,100 A | 12/1998 | Chi | 438/202 |
| 5,859,450 A | 1/1999 | Clark et al. | 257/233 |
| 5,926,706 A * | 7/1999 | Liaw et al. | 438/586 |
| 5,932,873 A | 8/1999 | Bergemont et al. | 250/208.1 |
| 6,100,551 A * | 8/2000 | Lee et al. | 438/66 |
| 6,207,984 B1 * | 3/2001 | Chang | 438/66 |
| 2002/0017695 A1 * | 2/2002 | Zhao et al. | 257/461 |

* cited by examiner

*Primary Examiner*—Michael Trinh
(74) *Attorney, Agent, or Firm*—George O. Saile; Stephen B. Ackerman

(57) ABSTRACT

A process for reducing the dark current generation of an image sensor cell, fabricated on a semiconductor substrate, has been developed. The process features the use of polysilicon pad structure, formed simultaneously with a polysilicon gate structure of a reset transistor, with the polysilicon pad structure located overlying, and contacting, a portion of the top surface of the photodiode element, of the image sensor cell. A small diameter opening, in a composite polysilicon-silicon oxide layer, exposes the portion of photodiode element to be contacted by the polysilicon pad structure. The small diameter opening is created using a procedure which allows the surface of the photodiode element, exposed in the small diameter opening to experience only a minimum of RIE processing at end point, thus minimizing damage to the surface of the photodiode element, and thus reducing dark current generation. A metal contact structure, used to communicate with the photodiode element, is then formed on the polysilicon pad structure.

24 Claims, 4 Drawing Sheets

METHOD OF REDUCING DARK CURRENT FOR AN IMAGE SENSOR DEVICE VIA USE OF A POLYSILICON PAD

BACKGROUND OF THE INVENTION (1) Field of the Invention

The present invention relates to methods used to fabricate semiconductor devices, and more specifically to a method used to fabricate an image sensor device.

(2) Description of the Prior Art

Active pixel sensor, (APS), cells, are usually comprised with a photodiode element, formed in a semiconductor substrate, as well as transfer transistor, and reset transistor structures. The peripheral regions of the APS cell contain the needed control and processing circuits, usually comprised of complimentary metal oxide semiconductor, (CMOS), devices. Therefore process sequences are chosen so that sharing, or simultaneous processing, for all needed devices, such as the photodiode element, and the transfer and reset transistor, as well as the peripheral devices, can be employed.

The photodiode element of the APS cell, which collects light, which is later converted to electrical signal, is sensitive to specific process steps or sequences. Damage to the surface of the photodiode element, as a result of exposure to specific process steps, such as reactive ion etching, (RIE), can result in unwanted dark current generation, for the APS cell. One such exposure of the photodiode to RIE procedures, occurs at the conclusion of a contact hole opening, formed in an insulator layer, exposing a portion of the top surface of the photodiode region for subsequent contact from an overlying metal structure. To insure opening of this contact, a RIE overetch cycle is sometimes used, resulting in the unwanted damage of the surface of the photodiode element, and the resulting deleterious dark current generation. This invention will offer methods that reduce, and prevent this type of RIE damage of the photodiode element, via the use of a polysilicon pad structure, placed overlying the photodiode element, thus absorbing the consequences of the RIE, contact opening procedure. Prior art, such as Chi, in U.S. Pat. No. 5,854,100, show an APS cell, however with the contact opening made directly on the top surface of the photodiode element.

SUMMARY OF THE INVENTION

It is an object of this invention to fabricate an active pixel sensor, (APS), cell, using a polysilicon pad structure located on a portion of the top surface of the photodiode element, to protect the photodiode element from RIE damage, occurring during the procedure used to open a contact hole to expose the photodiode element.

It is another object of this invention to form the polysilicon pad structure, on a thin oxide layer overlying the photodiode element, simultaneously with the formation of a polysilicon gate structure of a reset transistor structure, using a small diameter opening in the thin silicon oxide layer, created using RIE procedures, for contact of the polysilicon pad to the photodiode element.

It is still another object of this invention to form the small diameter opening, in a thin oxide layer, located on the photodiode element, using a wet etch procedure.

In accordance with the present invention a method of fabricating a APS cell, featuring the use of a polysilicon pad structure, located between an underlying photodiode element, and an overlying metal contact structure, is described. After formation of a photodiode element, in a semiconductor substrate, comprised of an N+ region, in a P well region, a gate insulator layer, and a thin polysilicon layer, are formed. A small diameter opening is created in the thin polysilicon layer, and in the gate insulator layer, exposing a portion of the top surface of the photodiode element, using either a RIE procedure, or an RIE procedure for the thin polysilicon layer followed by a wet etch procedure for the gate insulator layer. After deposition of a thick polysilicon layer, conventional photolithographic and RIE procedures, are used to define a polysilicon pad, comprised of the thick polysilicon layer, and the thin polysilicon layer, on the gate insulator layer, contacting the photodiode element, in the small diameter opening. The same procedure creates a polysilicon gate structure, for an adjacent reset transistor structure, comprised of the thick polysilicon layer, overlying the thin polysilicon layer, on the underlying gate insulator layer. After formation of insulator spacers, on the sides of the polysilicon gate structure, a source/drain region is formed in an area of the semiconductor substrate, used for the reset transistor, not covered by the polysilicon gate structure. A contact hole opening, is then formed in an interlevel dielectric, (ILD), layer, exposing a portion of the top surface of the polysilicon pad structure, followed by the formation of the metal contact structure, in the contact hole opening, communicating with the photodiode element via the polysilicon pad structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
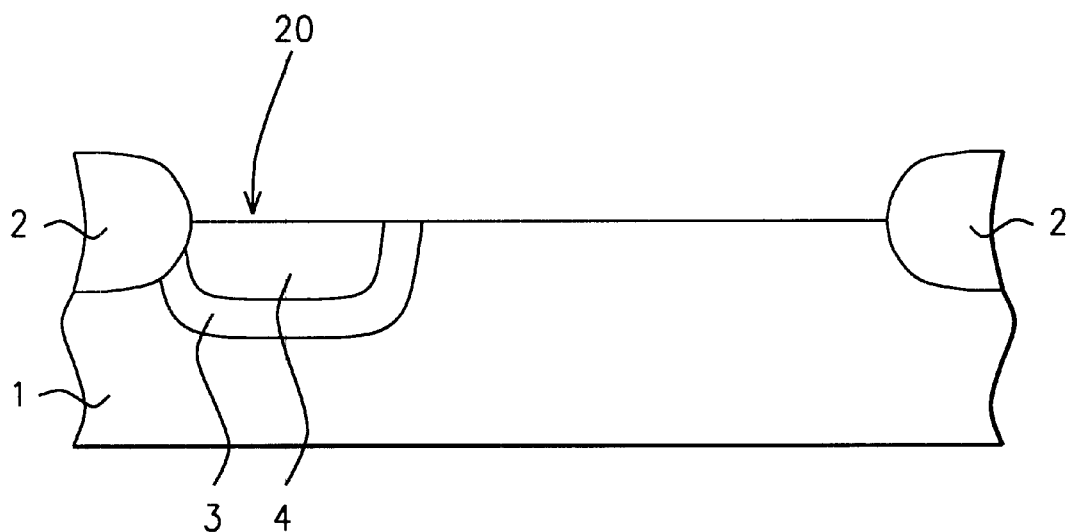
FIGS. 1–5, 6B, and 7, which schematically, in cross-sectional style, describe key stages of fabrication, used to create a APS cell featuring the use of a polysilicon pad structure, located overlying a portion of the top surface of the photodiode element, of the APS cell.

The method of fabricating an active pixel sensor, (cell), featuring a polysilicon pad structure located between an overlying metal contact structure, and an underlying photodiode element of the APS cell, will now be described in detail. A P type, semiconductor substrate 1, shown schematically in FIG. 1, is comprised of single crystalline silicon, with a <100>crystallographic orientation. Field oxide, (FOX), regions 2, used for isolation, comprised of silicon dioxide, are next formed. FOX regions 2, are formed at a thickness between about 2500 to 5500 Angstroms, via thermal oxidation of regions of semiconductor substrate 1, not protected by an oxidation resistant masking pattern. The oxidation resistant masking pattern, comprised of a composite layer of silicon nitride on silicon oxide, is obtained via deposition of a silicon oxide and of an overlying silicon nitride layer, via low pressure chemical vapor deposition, (LPCVD), or plasma enhanced chemical vapor deposition, (PECVD), procedures, followed by conventional photolithographic and RIE procedures, used to define the desired oxidation resistant masking pattern in the silicon nitride and silicon oxide layers. The photoresist shape, used to define the oxidation resistant masking pattern is removed via plasma oxygen ashing and careful wet clean procedures, prior to the oxidation procedure, used to from FOX regions 2. This is schematically shown in FIG. 1.

The formation of a photodiode element, for the APS cell, is next addressed. A photoresist shape, not shown in the drawings, is used as a block out mask, allowing P well region 3, to be formed in the region of the APS cell to be used for the photodiode element. P well region 3, is formed via an ion implantation procedure, using boron, or $BF_2$ ions, at an energy between about 80 to 100 KeV, at a dose between about 6E12 to 8E12 atoms/cm$^2$. After removal of the photoresist shape used for definition of P well region 3, via plasma oxygen ashing and careful wet cleans, another photoresist shape, again not shown in the drawings, is used as a block out mask, to allow N+ region 4, to be created in a top portion of P well region 3. This is accomplished via ion implantation of arsenic, or phosphorous ions, at an energy between about 40 to 60 KeV, at a dose between about 2E15 to 4E15 atoms/cm$^2$, resulting in the completion of photodiode element 20, schematically shown in FIG. 1, comprised of N+ region 4, in P well region 3. Removal of the photoresist shape, used as a block out mask during the formation of N+ region 4, is again removed via plasma oxygen ashing and careful wet cleans.

Figure 2:
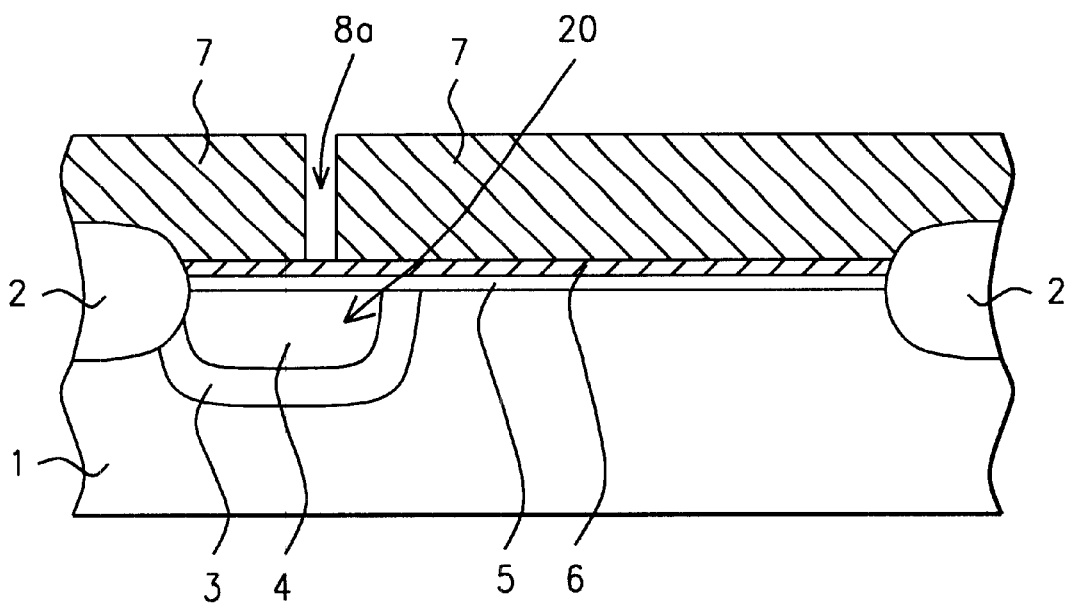

A thin silicon dioxide layer 5, is next thermally grown, in an oxygen-steam ambient, to a thickness between about 100 to 125 Angstroms, followed by the deposition of thin polysilicon layer 6, via LPCVD procedures, at a thickness between about 200 to 500 Angstroms. This is schematically shown in FIG. 2. Photoresist shape 7, is next formed on thin polysilicon layer 6, with opening 8a, exposing a portion of the top surface of thin polysilicon layer 6, in a region directly overlying N+ region 4, of photodiode element 20. The diameter of opening 8a, is between about 500 to 1000 Angstroms.

Critical opening 8b, is next formed in thin polysilicon layer 6, and in thin silicon dioxide layer 5, using photoresist shape 7, with opening 8a, as a mask. The objective of this procedure, the creation of opening 8b, exposing a portion of the top surfa6e of N+ region 4, of photodiode element 20, is to limit the exposure, or limit the amount of surface area, of N+ region 4, to a RIE procedure, used to form opening 8b. Increased exposure to the RIE procedure results in surface damage of N+ region 4, resulting in unwanted photodiode, dark current generation. Therefore two iterations are used to limit, or to prevent, the RIE damage phenomena. A first iteration features the use of a RIE procedure, using $Cl_2$ as an etchant, for thin polysilicon layer 6, while using $CHF_3$ as an etchant for thin silicon dioxide layer 5, creating opening 8b, schematically shown in FIG. 3. The small diameter, between about 500 to 1000 Angstroms, of opening 8b, limits the amount of damage to the surface of the photodiode element, when compared to a conventional process sequence in which a larger diameter opening is formed to allow a metal structure to directly contact the photodiode element. In addition less of an overetch cycle is needed to insure complete removal of thin silicon dioxide layer 5, therefore the photodiode surface is exposed to the RIE procedure for less time than counterparts in which a longer overetch cycle is needed to insure the complete removal of a thicker insulator layer, used with the conventional metal contact structure, placed directly on the surface of the photodiode element.

Figure 3:
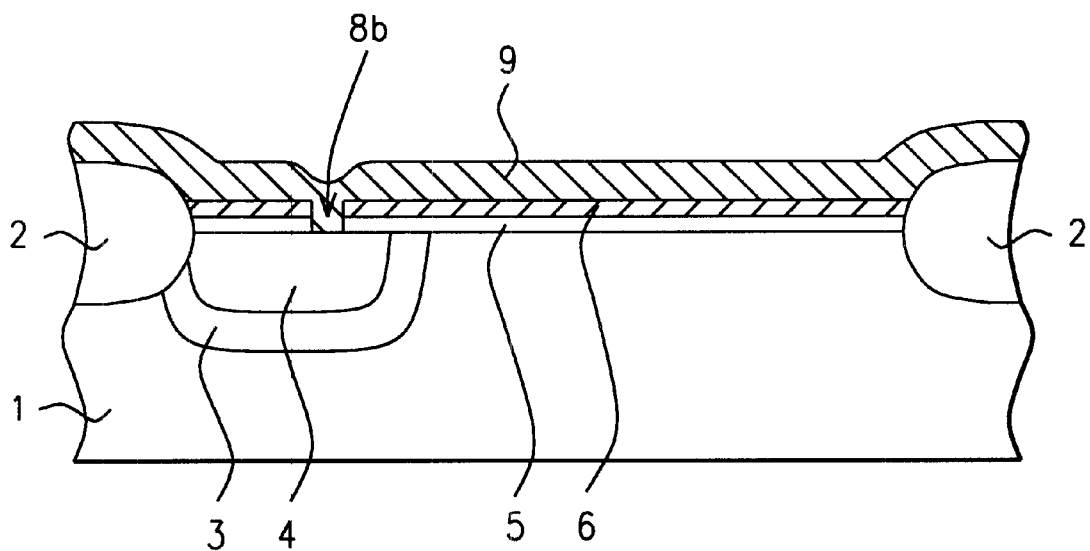

A second iteration of this invention is the use of a RIE—wet etch procedure for opening 8b. This is accomplished using an RIE cycle to define opening 8b, in thin polysilicon layer 6, followed by a wet etch cycle, using a buffered hydrofluoric acid solution, used to define opening 8b, in thin silicon dioxide layer 5. The RIE—wet etch procedure, or the absence of a concluding RIE cycle, prevents damage to the surface of photodiode element 20. After the creation of opening 8b, photoresist shape 7, is removed via plasma oxygen ashing and careful wet cleans. A thick polysilicon layer 9, is then deposited via LPCVD procedures, to a thickness between about 1000 to 1500 Angstroms, completely filling opening 8b. Thick polysilicon layer 9, schematically shown in FIG. 3, is either doped in situ, during deposition, via the addition of arsine, or phosphine, to a silane ambient, or thick polysilicon layer 9, is deposited intrinsically then doped via ion implantation of arsenic, or phosphorous ions.

Figure 4:
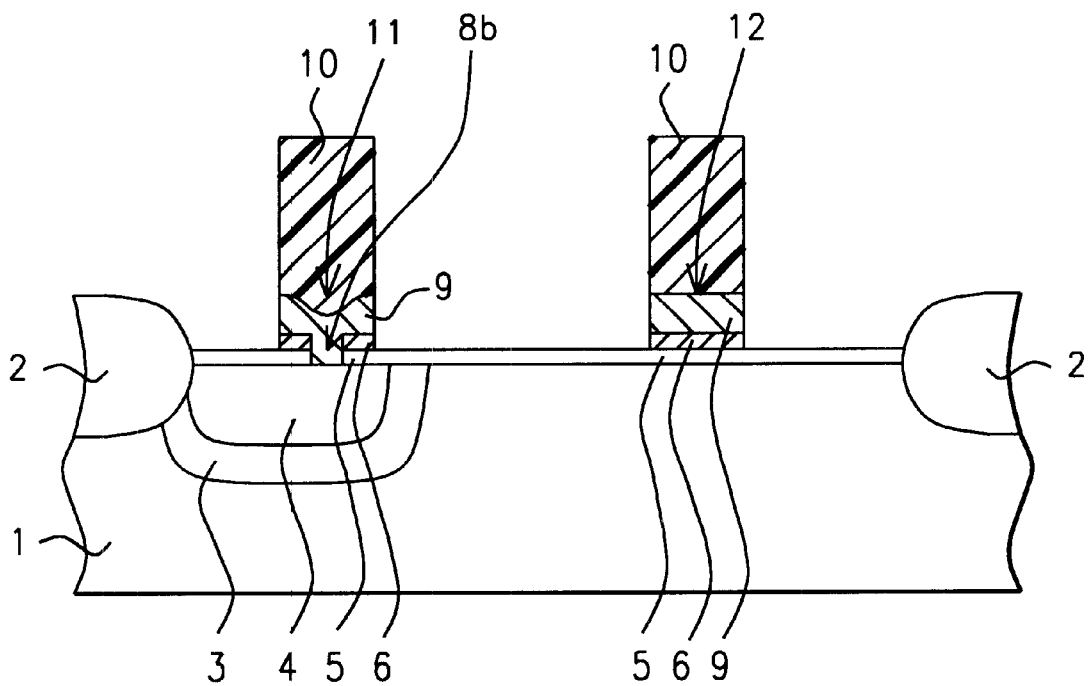
Figure 5:
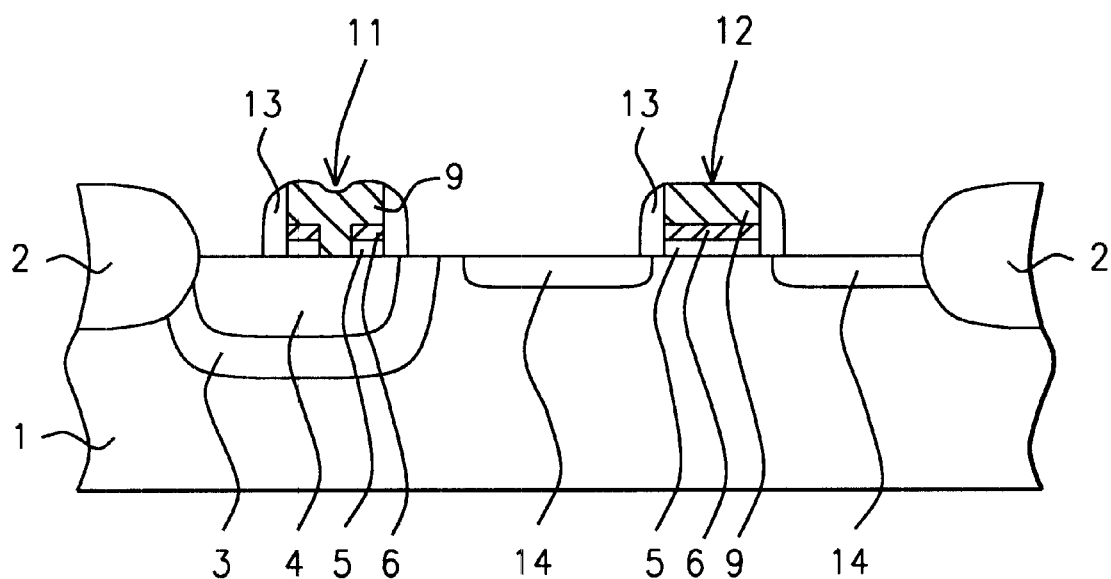

Definition of polysilicon pad structure 11, and polysilicon gate structure 12, are next addressed and schematically shown in FIG. 4. Photoresist shapes 10, are used as a mask to allow an anisotropic RIE procedure, using $Cl_2$ as an etchant, to define polysilicon pad structure 11, and polysilicon gate structure 12, in thick polysilicon layer 9, and in thin polysilicon layer 6. Removal of photoresist shapes 10, is accomplished via plasma oxygen ashing and careful wet cleans, with a a buffered hydrofluoric acid dip used as part of the wet clean procedure, resulting in removal of the regions of thin silicon dioxide layer 5, not covered by polysilicon pad structure 11, or by polysilicon gate structure 12. Insulator spacers 13, such as silicon oxide, or silicon nitride, are next formed on the sides of polysilicon pad structure 11, and on the sides of polysilicon gate structure 12. This is accomplished via deposition of the insulator layer, silicon oxide, or silicon nitride, via LPCVD or PECVD procedures, to a thickness between about 2000 to 3000 Angstroms, followed by an anisotropic RIE procedure, using $CHF_3$ as an etchant, forming insulator spacers 13. This is schematically shown in FIG. 5. A photoresist block out shape, not shown in the drawings, is next used to protect the photodiode region from an implantation procedure, used to create source/drain regions 14, for a reset transistor structure. The ion implantation procedure, used to create N type, source/drain region 14, shown schematically in FIG. 5, is performed using arsenic, or phosphorous ions, at an energy between about 40 to 60 KeV, at a dose between about 2E15 to 6E15 atoms/cm$^2$ The photoresist shape, used as a block out mask for the source/drain implant procedure, is then removed using plasma oxygen ashing and careful wet cleans.

Figure 6A:
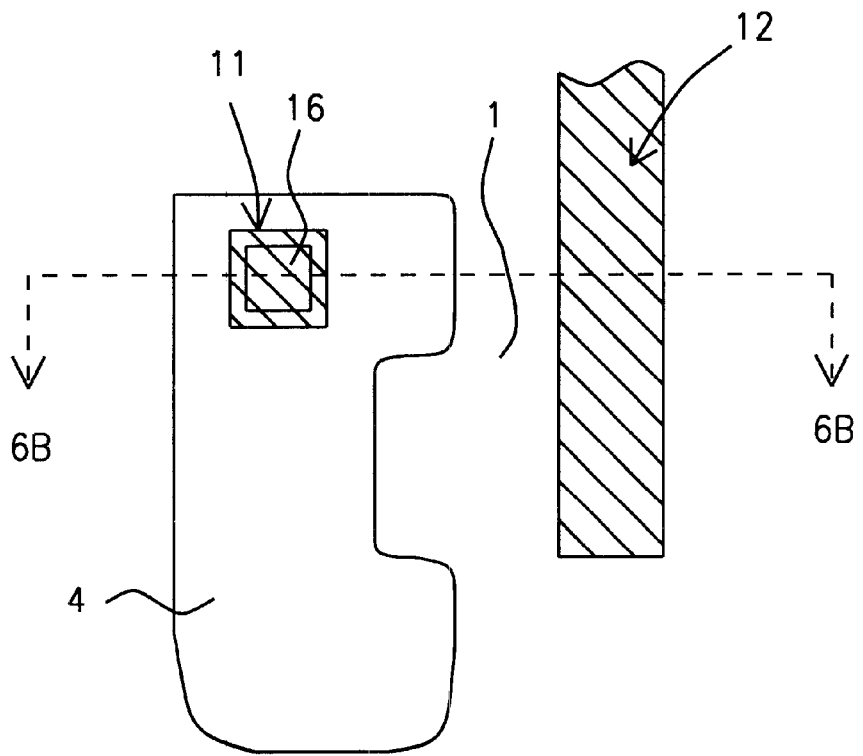
FIG. 6A, which schematically shows a top view of the APS cell, comprised with a polysilicon pad structure, located between an overlying metal contact structure, and an underlying photodiode element, of the APS cell.
Figure 6B:
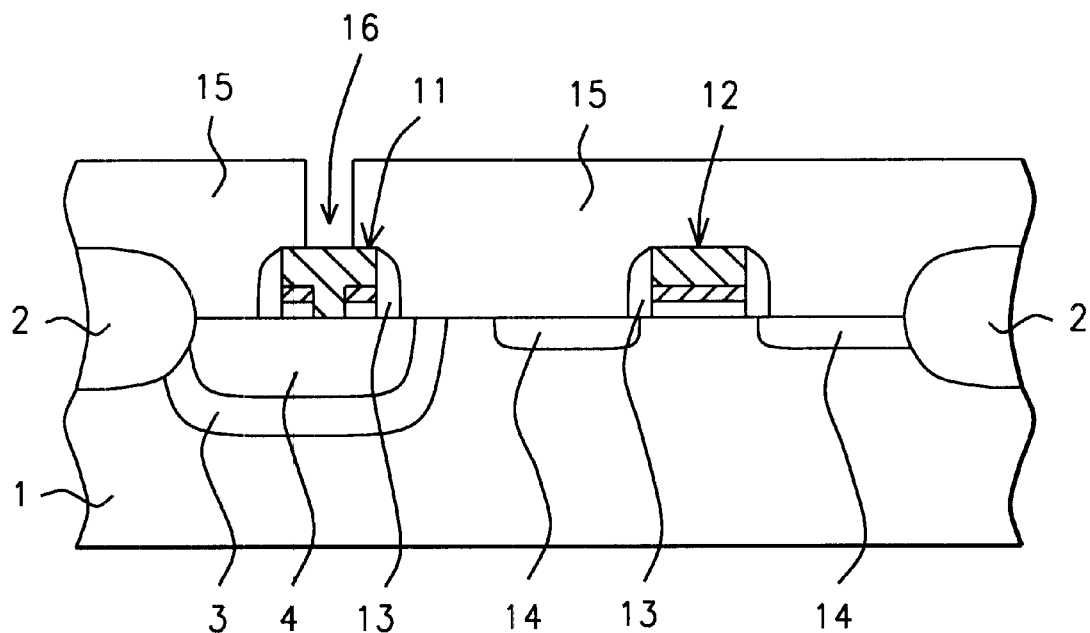

An interlevel dielectric, (ILD), layer 15, such as silicon oxide, or borophosphosilicate glass, (BPSG), is deposited via LPCVD or PECVD procedures, to a thickness between about 9000 to 11000 Angstroms. A photoresist shape, not shown in the drawings, is used as a mask to allow an anisotropic RIE procedure, using $CHF_3$ as an etchant, to form contact opening 16, in ILD layer 15, exposing a portion of the top surface of polysilicon pad structure 11. This is schematically shown, in cross-sectional style in FIG. 6B, and as a top view in FIG. 6A. The diameter of contact opening 16, is between about 5000 to 7000 Angstroms, larger than the diameter of opening 8b. If an opening to the photodiode element would have been formed with a diameter equal to the diameter of contact opening 16, a greater degree of surface damage would have been inflicted to the photodiode. Therefore the use of the polysilicon pad structure allowed the diameter of the opening to the photodiode to be decreased to a level in which RIE damage was minimal. The deleterious dark current, arising with the use of the direct, larger diameter contact opening to the surface of the photodiode element was determined to be about 40 mV/sec, while the use of the polysilicon pad, describe din this invention, resulted in a dark current generation of only about 10 mV/sec. The photoresist shape, used to define contact opening 16, is again removed using plasma oxygen ashing and careful wet clean procedures.

Figure 7:
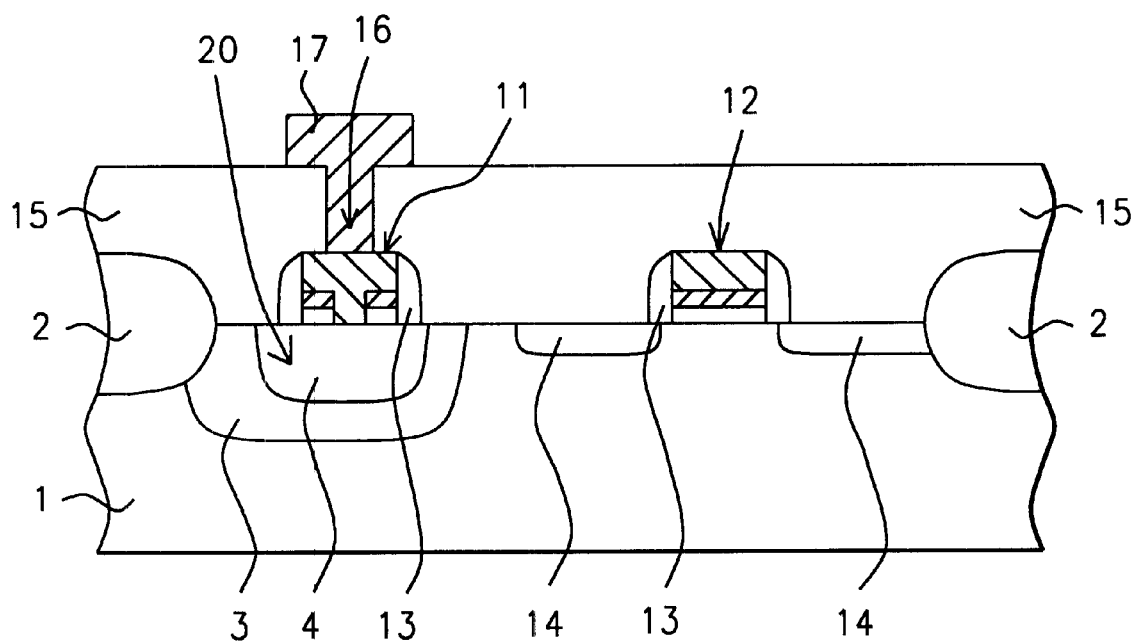

Metal contact structure 17, shown schematically in FIG. 7, is then formed, filling contact opening 16, contacting the top surface of photodiode element 20. Metal contact structure 17, comprised of either aluminium, aluminum-copper, or tungsten, is formed via deposition of the metal layer, using plasma vapor deposition, or via chemical vapor deposition procedures. Conventional photolithographic and RIE procedures, using $Cl_2$ as an etchant, are used to define metal contact structure 17. Although not shown in the drawings, contact openings, and metal contact structures, are also formed to the polysilicon gate structure 12, and to source/drain region 14, of the reset transistor structure.

While this invention has been particularly shown and described with reference to the preferred embodiments thereof, it will be understood by those skilled in the art that various changes in form and details may be made without departing from the spirit and scope of this invention.

What is claimed is:

1. A method of fabricating an image sensor cell, on a semiconductor substrate, comprising the steps of forming a photodiode element, in a first portion of a semiconductor substrate, comprised of an underlying well region, of a first conductivity type, and an overlying doped region, of a second conductivity type;

growing a thin insulator layer on the surface of said semiconductor substrate;

depositing a first polysilicon layer;

forming a first opening in said first polysilicon layer, and in said thin insulator layer, exposing a portion of the top surface of said doped region of said photodiode element;

depositing a second polysilicon layer, completely filling said first opening;

patterning of said second polysilicon layer, and of said first polysilicon layer, to form a polysilicon pad structure overlying a position of said thin insulator layer, contacting the region of said photodiode region, exposed in said first opening, and to form a polysilicon gate structure, on said thin insulator layer, overlying a second portion of said semiconductor substrate;

forming insulator spacers on the sides of said polysilicon gate structure, and on the sides of said polysilicon pad structure, and forming a source/drain region, of a second conductivity type, in a region of said second portion of said semiconductor substrate, not covered by said polysilicon gate structure, creating a reset transistor for said image sensor cell;

depositing an interlevel dielectric, (ILD), layer;

forming a second opening, in said ILD layer, exposing a portion of the top surface of said polysilicon pad structure; and forming a metal structure, filling said second opening, and overlying a portion of said ILD layer.

2. The method of claim 1, wherein said semiconductor substrate is a P type semiconductor substrate.

3. The method of claim 1, wherein said underlying well region, of said photodiode element, is a P well region, formed via ion implantation of boron or $BF_2$ ions, at an energy between about 80 to 100 KeV, at a dose between about 6E12 to 8E12 atoms/cm$^2$.

4. The method of claim 1, wherein said overlying doped region, of said photodiode element, is an N type region, obtained via ion implantation of arsenic or phosphorus ions, at an energy between about 40 to 60 KeV, at a dose between about 2E15 to 4E15 atoms/cm$^2$.

5. The method of claim 1, wherein said thin gate insulator layer is a silicon dioxide layer, obtained via thermal oxidation procedures at a thickness between about 100 to 125 Angstroms.

6. The method of claim 1, wherein said first polysilicon layer is obtained LPCVD procedures, at a thickness between about 200 to 500 Angstroms.

7. The method of claim 1, wherein said first opening is formed, with a diameter between about 500 to 1000 Angstroms.

8. The method of claim 1, wherein said first opening is formed via an anisotropic RIE procedure, using $Cl_2$ as an etchant for said first polysilicon layer, and using $CHF_3$ as an etchant for said thin insulator layer.

9. The method of claim 1, wherein said first opening is formed using as anisotropic RIE procedure, for said first polysilicon layer, and using a buffered hydrofluoric acid, wet etch procedure, to etch said thin insulator layer.

10. The method of claim 1, wherein said second polysilicon layer is obtained via LPCVD procedures, to a thickness between about 1000 to 1500 Angstroms, with said second polysilicon layer either doped in situ, during deposition, via the addition of arsine, or phosphine, to a silane ambient, or with said second polysilicon layer deposited intrinsically then doped via implantation of arsenic, or phosphorous ions.

11. The method of claim 1, wherein said polysilicon pad structure is obtained via anisotropic RIE procedures, using $Cl_2$ as an etchant for said second polysilicon layer, and for said first polysilicon layer.

12. The method of claim 1, wherein said ILD layer is either a silicon oxide layer, or a borophosphosilicate glass layer, obtained via LPCVD or PECVD procedures, at a thickness between about 9000 to 11000 Angstroms.

13. The method of claim 1, wherein said second opening, in said ILD layer, is formed with a diameter between about 5000 to 7000 Angstroms.

14. A method of forming an image sensor cell, on a semiconductor substrate, featuring a polysilicon pad structure, overlying a portion of a photodiode element, and underlying a metal contact structure, comprising the steps of forming a P well region in a first portion of said semiconductor substrate, to be used for said photodiode element;

forming an N+ region in a top portion of said P well region, creating said photodiode element comprised of said N+ region, in said P well region;

growing a silicon dioxide gate insulator layer;

depositing a thin polysilicon layer;

creating a small diameter, first opening, in said thin polysilicon layer, and in said silicon dioxide gate insulator layer, exposing a portion of the top surface of said photodiode element, with said first opening formed using a RIE procedure for said thin polysilicon layer, and using a wet etch procedure for said silicon dioxide gate insulator layer;

depositing a thick polysilicon layer, completely filling said first opening;

patterning of said thick polysilicon layer, and of said thin polysilicon layer to form said polysilicon pad structure, on said silicon dioxide gate insulator layer, contacting said photodiode element, in said first opening, and to form a polysilicon gate structure, on said silicon dioxide gate insulator layer, on a second portion of said semiconductor substrate, to be used for a reset transistor structure;

depositing an ILD layer;

creating a second opening, in said ILD layer, exposing a portion of the top surface of said photodiode element; and forming said metal contact structure, overlying said ILD layer, and completely filling said second opening, contacting said polysilicon pad structure.

15. The method of claim 14, wherein said P well region is formed via ion implantation of boron or $BF_2$ ions, at an energy between about 80 to 100 KeV, at a dose between about 6E12 to 8E12 atoms/cm$^2$.

16. The method of claim 14 wherein said N+ region is obtained via ion implantation of arsenic or phosphorous ions, at an energy between about 40 to 60 KeV, at a dose between about 2E15 to 4E15 atoms/cm$^2$.

17. The method of claim 14, wherein said silicon dioxide gate insulator layer is obtained via thermal oxidation procedures at a thickness between about 100 to 125 Angstroms.

18. The method of claim 14, wherein said thin polysilicon layer is obtained LPCVD procedures, at a thickness between about 200 to 500 Angstroms.

19. The method of claim 14, wherein said small diameter, first opening is formed, with a diameter between about 500 to 1000 Angstroms.

20. The method of claim 14, wherein said first opening is formed using as anisotropic RIE procedure, for said first polysilicon layer, using $Cl_2$ as an etchant, and using a buffered hydrofluoric acid, wet etch procedure, to etch said silicon dioxide gate insulator layer.

21. The method of claim 14, wherein said thick polysilicon layer is obtained via LPCVD procedures, to a thickness between about 1000 to 1500 Angstroms, with said thick polysilicon layer either doped in situ, during deposition, via the addition of arsine, or phosphine, to a silane ambient, or with said thick polysilicon layer deposited intrinsically then doped via implantation of arsenic, or phosphorous ions.

22. The method of claim 14 wherein said polysilicon pad structure is defined via anisotropic RIE procedures, using $Cl_2$ as an etchant for said thick polysilicon layer, and for said thin polysilicon layer.

23. The method of claim 14, wherein said ILD layer is either a silicon oxide layer, or a borophosphosilicate glass layer, obtained via LPCVD or PECVD procedures, at a thickness between about 9000 to 11000 Angstroms.

24. The method of claim 14, wherein said second opening, in said ILD layer, is formed with a diameter between about 5000 to 7000 Angstroms.

* * * * *